United States Patent
Chen et al.

[11] Patent Number: 6,121,109
[45] Date of Patent: Sep. 19, 2000

[54] METHOD OF FORMING HEMISPHERICAL GRAIN POLYSILICON OVER LOWER ELECTRODE CAPACITOR

[75] Inventors: Shih-Ching Chen, Nantou Hsien; Neng-Hsing Shen, Hsinchu Hsien, both of Taiwan

[73] Assignee: United Semiconductor Corp., Shinchu, Taiwan

[21] Appl. No.: 09/191,327

[22] Filed: Nov. 13, 1998

[30] Foreign Application Priority Data

Oct. 3, 1998 [TW] Taiwan ................... 87116480

[51] Int. Cl.$^7$ ................................ H01L 21/20
[52] U.S. Cl. ................ 438/396; 438/398; 438/253; 438/255
[58] Field of Search ................ 438/396, 398, 438/238, 239, 253, 255

[56] References Cited

U.S. PATENT DOCUMENTS

| | | | |
|---|---|---|---|
| 5,227,322 | 7/1993 | Ko et al. | 438/387 |
| 5,340,765 | 8/1994 | Dennison et al. | 438/398 |
| 5,837,581 | 11/1998 | Cheng | 438/255 |
| 5,858,835 | 1/1999 | Lin | 438/253 |
| 5,858,838 | 1/1999 | Wang et al. | 438/255 |
| 5,874,336 | 2/1999 | Cherng | 438/255 |
| 6,022,775 | 2/2000 | Tsai et al. | 438/253 |

*Primary Examiner*—Carl Whitehead, Jr.
*Assistant Examiner*—Jamie L. Davis
*Attorney, Agent, or Firm*—Jiawei Huang; J. C. Patents

[57] ABSTRACT

A method of forming a layer of hemispherical grain polysilicon over the lower electrode of a capacitor. The method comprises the steps of providing a substrate that has a field effect transistor already formed thereon, and then forming an insulating layer with a contact opening over the substrate. Subsequently, a polysilicon layer is formed over the insulating layer that completely fills the contact opening. This polysilicon layer is electrically coupled to one of the source/drain regions of the field effect transistor. Thereafter, a thin buffer layer is formed over the polysilicon layer, and then the thin buffer layer is patterned. The thin buffer layer is used as a mask for covering the polysilicon layer that is to be part of the lower electrode of a capacitor. Next, a plasma etching operation is carried out to remove the thin buffer layer and a portion of the polysilicon layer at the same time. Finally, a heat treatment is carried out to form a hemispherical grain polysilicon layer over the surface of the lower electrode.

29 Claims, 4 Drawing Sheets

METHOD OF FORMING HEMISPHERICAL GRAIN POLYSILICON OVER LOWER ELECTRODE CAPACITOR

CROSS-REFERENCE TO RELATED APPLICATION

This application claims the priority benefit of Taiwan application serial no. 87116480, filed Oct. 3, 1998, the full disclosure of which is incorporated herein by reference.

BACKGROUND OF THE INVENTION

1. Field of Invention

The present invention relates to a method of forming a dynamic random access memory (DRAM) capacitor. More particularly, the present invention relates to a method of forming a hemispherical grain (HSG) polysilicon layer over the lower electrode of a DRAM capacitor so that the lower electrode has a larger surface area and hence is able to have a higher charge storage capacity.

2. Description of Related Art

A conventional DRAM cell is constructed from a MOS transistor and a capacitor. The capacitor functions as a signal storage device, and therefore plays a vital role in the operation of a DRAM cell. If the number of charges stored in a capacitor is high, noise interference when data are read from the capacitor are less and of refresh frequency is lower.

In the design of very large scale integrated (VLSI) circuits, one method of increasing a capacitor's capacitance is to increase storage node surface area. This is because capacitance value is proportional to the surface area of the storage node or electrode, which are made from a conductive material. At present, fin types or hemispherical grain structures are used to increase the surface area of storage nodes. However, manufacturing methods for fin type or hemispherical grain structures are quite complicated, and hence mass production is rather difficult. Therefore, the simpler, stacking method of increasing surface area is still employed. Nevertheless, one common method of increasing surface area and hence its charge storage capacity of a capacitor is to form a layer of hemispherical grain (HSG) polysilicon over the lower electrode.

In the conventional method of manufacturing DRAM capacitors, hemispherical grain (HSG) polysilicon is normally grown over the surface of a polysilicon lower electrode. The HSG polysilicon is a layer having a large number of hemispherical silicon grains which increases the surface area of an electrode plate.

In general, the HSG polysilicon layer is fabricated on a substrate by heating the substrate to a temperature of about 530° C. so that a layer of amorphous polysilicon forms on substrate surface. This amorphous polysilicon layer is also know as α-silicon. Next, by heating to the phase transfer temperature of about 560° C. to 590° C., a hemispherical grain polysilicon layer is grown over the α-silicon. However, even in this temperature range, a small amount of crystalline micro-crystals will also form on the surface of the α-silicon. Hence, care must be taken to keep the phase transfer temperature below 600° C., or else a large fraction of the polysilicon material will be converted to crystalline polysilicon, which has a much lower electrical conductivity.

FIGS. 1A through 1E are cross-sectional views showing the progression of manufacturing steps in fabricating the lower electrode of a capacitor using hemispherical grain polysilicon, according to a conventional method.

First, as shown in FIG. 1A, a DRAM field effect transistor 102 is formed in a substrate 100. The field effect transistor 102 includes a gate structure 104 and source/drain regions 105 and 106. The gate 104 and the source/drain regions 105, 106 are formed in the active region of the substrate 100, and are separated from neighboring devices by insulating material such as field oxide region 101. Next, an insulating layer 108 is formed over the substrate 100. The insulating layer 108 can be a silicon dioxide layer formed by chemical vapor deposition, for example. Alternatively, the insulating layer 108 can be a borophosphosilicate glass (BPSG) layer.

Thereafter, as shown in FIG. 1 B. conventional photolithographic and etching method can be used to pattern the insulating layer 108, forming an insulating layer 108a having a contact opening 109 that exposes one of the source/drain regions 106.

Next, as shown in FIG. 1C, a polysilicon layer 110 is formed over the insulating layer 108a and completely filling the contact opening 109. The polysilicon layer 110 (or α-silicon) can be formed by a chemical vapor deposition (CVD) using silane $SiH_4$ and phosphine $PH_3$ as the main reactive gases, for example. In order to prevent the formation of crystalline polysilicon, reaction temperature is set to a level below 530° C. This reduces the possibility of forming crystalline polysilicon is to a minimum. Since the conventional temperature for depositing polysilicon must be below 530° C., polysilicon deposition takes longer.

In general, impurities can be implanted into the polysilicon layer 110 to increase its electrical conductivity. Next, a patterned photoresist layer 114 is formed over the polysilicon layer 110. The patterned photoresist layer 114 acts as a mask for patterning the polysilicon layer 110 in the subsequent step.

Next, as shown in FIG. 1D, conventional photolithographic and etching methods, for example, a dry etching method (that is, a plasma etching method), are used to pattern the polysilicon layer 110 into a portion of the lower electrode. The polysilicon layer 110 is etched to form a polysilicon layer 110a; etching continues until the insulating layer 108a is exposed. When the polysilicon layer 110 is plasma-etched, the sidewall surfaces 116a of the polysilicon layer 110a are also bombarded. Hence, the sidewall surfaces 116a become more amorphous.

Next, as shown in FIG. 1E, the photoresist 114 is removed. Because the top surface of the polysilicon layer 110a is covered by the photoresist layer 114 in the previous plasma-etching operation, a fraction of the micro-crystals still exists on the surface of the hemispherical grain polysilicon. Therefore, distribution of hemispherical grain polysilicon on the polysilicon layer 110a cannot be uniform. Even though the temperature is now raised to about 560–590° C. to create more hemispherical grain polysilicon, top surface 116b of the polysilicon layer 110a already contains previously formed micro-crystals. In the presence of previously formed micro-crystals, it is difficult to increase effective surface area on the top surface 116b of the polysilicon layer 110a.

Although the aforementioned method of forming a stacked type of capacitor is simple, the resulting surfaces of the conductor layer that functions as the lower electrode have a non-uniform distribution of hemispherical grain polysilicon due to the presence of micro-crystals. Therefore, the effective surface of the stacked DRAM capacitor fabricated with a layer of hemispherical grain polysilicon on its electrode is lower than expected, and hence capacity to store charges in the capacitor is reduced. Moreover, the deposition temperature for depositing polysilicon must be below 530° C., which lengthens deposition time.

In light of the foregoing, there is a need to improve the fabrication method for the lower electrode of a DRAM capacitor.

SUMMARY OF THE INVENTION

Accordingly, the present invention provides a method of manufacturing DRAM capacitor. The method utilizes the damaging action of plasma on the surface of a polysilicon layer to form an amorphous polysilicon layer so that micro-crystals are also eliminated. This reduces the effects of micro-crystals on the process of forming a hemispherical grain polysilicon layer over the surface of a lower conductive electrode are reduced. Consequently, there is a corresponding increase in the effective surface area of the stacked DRAM capacitor and its charge storage capacity.

To achieve these and other advantages and in accordance with the purpose of the invention, as embodied and broadly described herein, the invention provides a method of forming a layer of hemispherical grain polysilicon over the lower electrode of a capacitor. The method comprises the steps of providing a substrate that has a field effect transistor already formed thereon, and then forming an insulating layer over the substrate. Next, a contact opening is formed in the insulating layer. Subsequently, a polysilicon layer is formed over the insulating layer that completely fills the contact opening. This polysilicon layer is electrically coupled to one of the source/drain regions of the field effect transistor. Thereafter, a thin buffer layer is formed over the polysilicon layer, and the thin buffer layer is patterned. The thin buffer layer is used as a mask, covering the polysilicon layer that becomes the lower electrode of a capacitor. Next, a plasma etching operation is carried out to remove the thin buffer layer and a portion of the polysilicon layer at the same time. Finally, a heat treatment is carried out to form a hemispherical grain polysilicon layer on the surface of the lower electrode.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
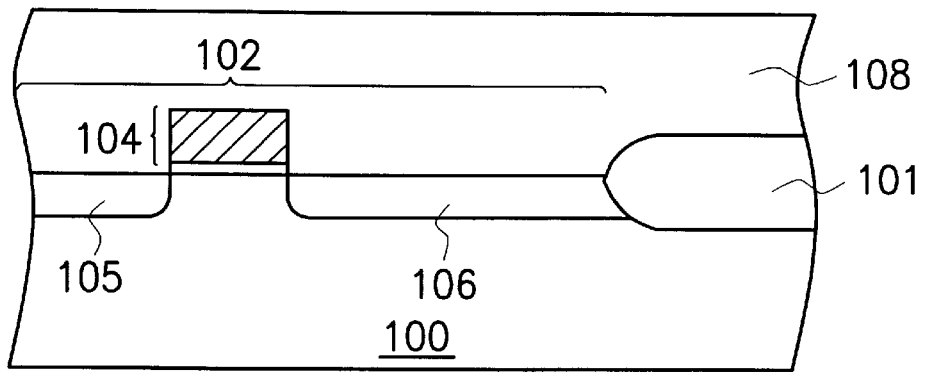
FIGS. 1A through 1E are cross-sectional views showing the progression of manufacturing steps in fabricating the lower electrode of a capacitor using hemispherical grain polysilicon, according to a conventional method.
Figure 1B:
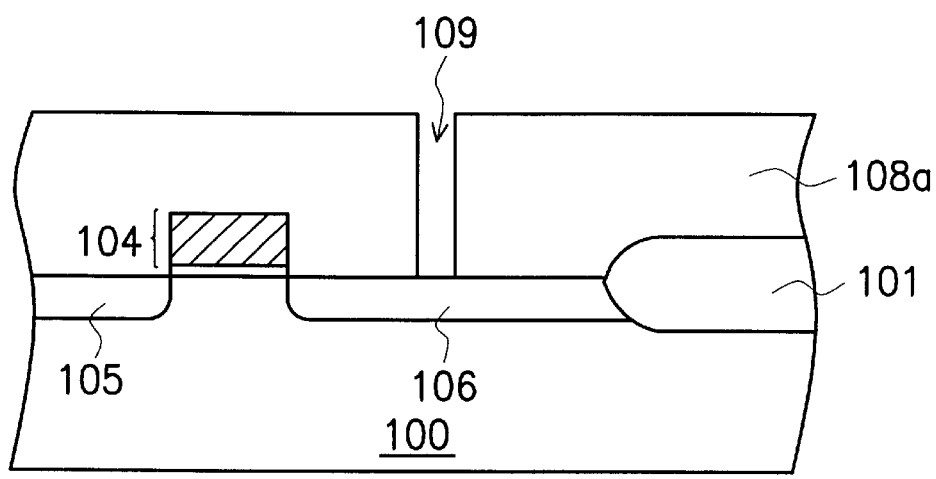
Figure 1C:
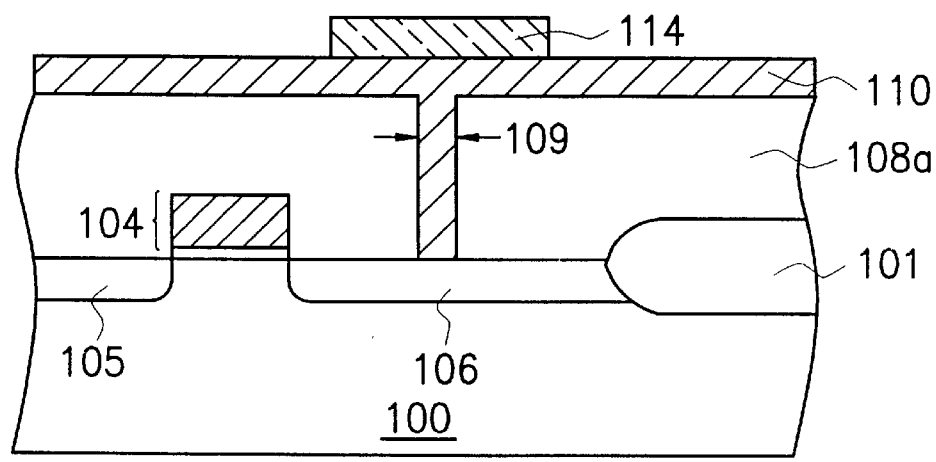
Figure 1D:
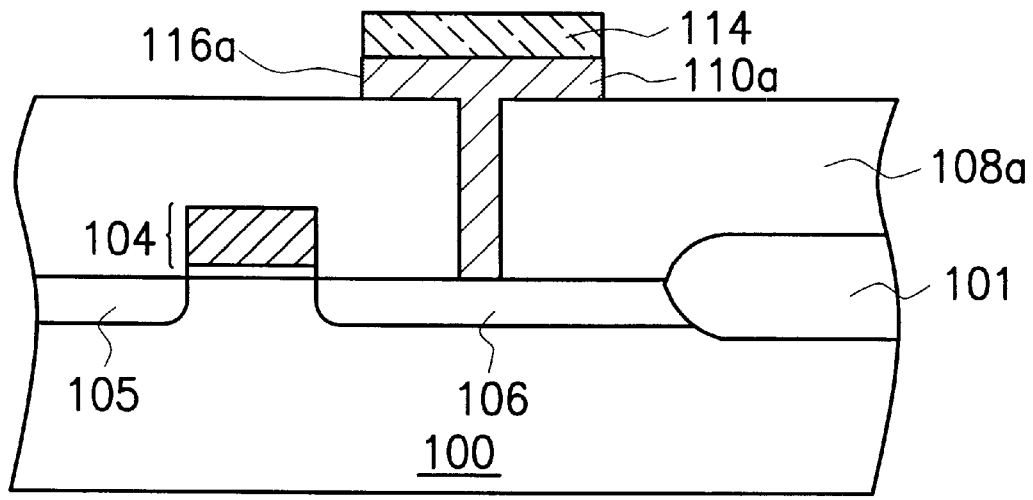
Figure 1E:
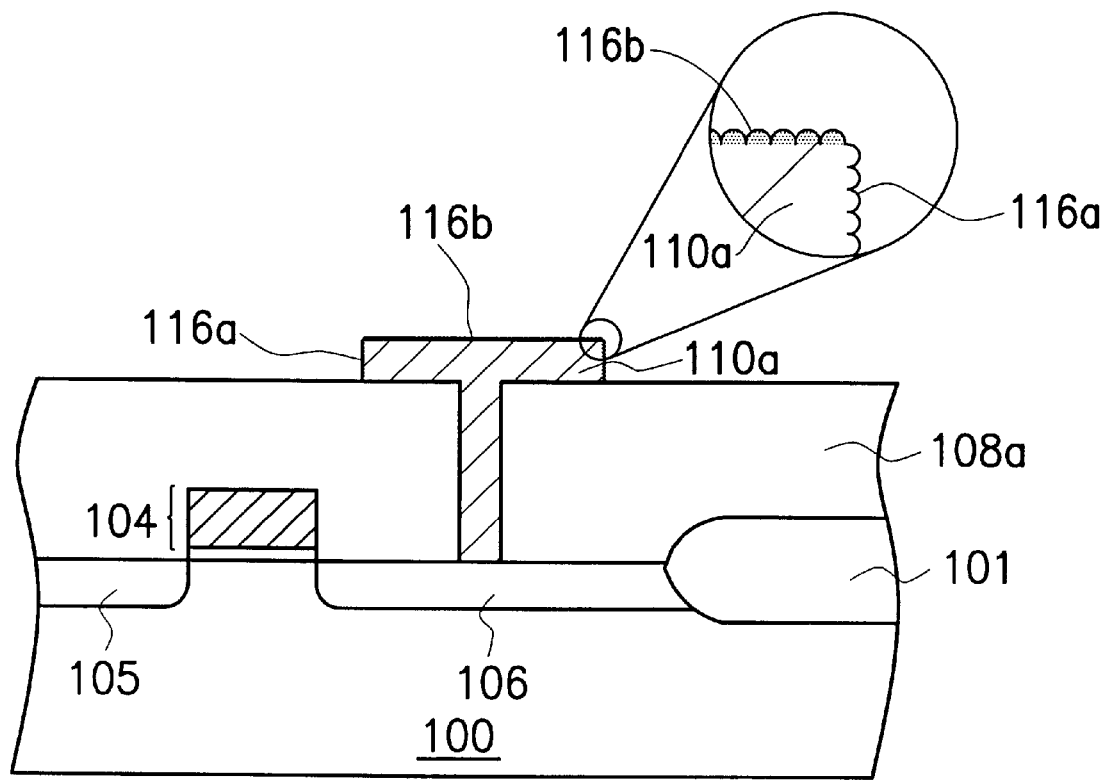

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are cross-sectional views showing the progression of manufacturing steps in fabricating the lower electrode of a capacitor using hemispherical grain polysilicon, according to one preferred embodiment of this invention.

Figure 2A:
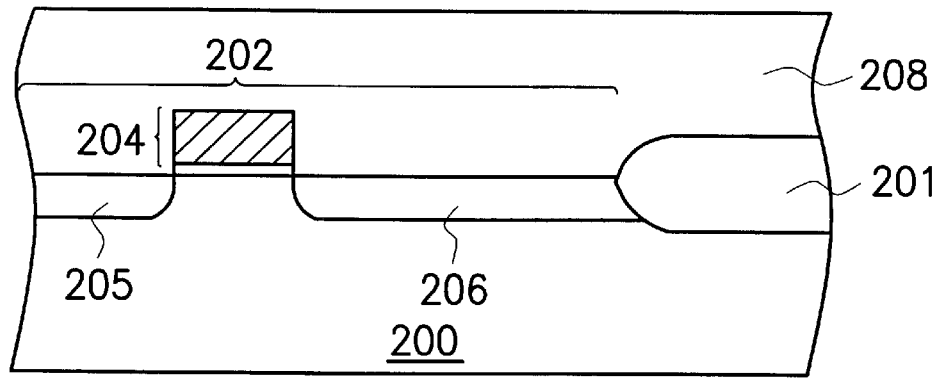
FIGS. 2A through 2E are cross-sectional view showing the progression of manufacturing steps in fabricating the lower electrode of a capacitor using hemispherical grain polysilicon, according to one preferred embodiment of this invention.

First, as shown in FIG. 2A, a substrate 200, for example, a P-type silicon substrate is provided. Then, a DRAM field effect transistor 202 is formed in the substrate 200. The field effect transistor 202 includes a gate structure 204 and source/drain regions 205 and 206. The gate 204 and the source/drain regions 205, 206 are formed in the active region of the substrate 200, and are separated from neighboring devices by insulating material such as field oxide region 201. Next, an insulating layer 208 is formed over the substrate 200. The insulating layer 208 can be a silicon dioxide layer formed by chemical vapor deposition, for example. Alternatively, the insulating layer 208 can be a borophosphosilicate glass (BPSG) layer.

Figure 2B:
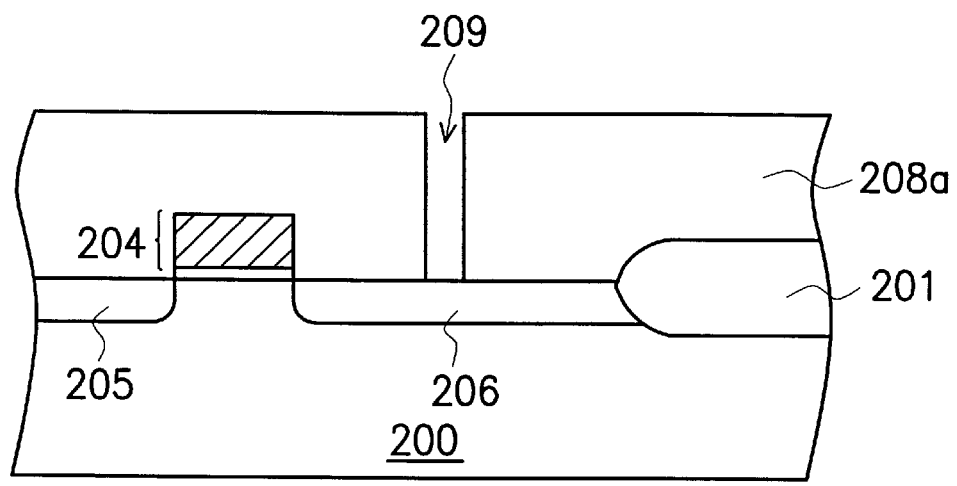

Thereafter, as shown in FIG. 2B, conventional photolithographic and etching methods can be used to pattern the insulating layer 208 to form an insulating layer 208a with a contact opening 209 that exposes one of the source/drain regions 206.

Figure 2C:
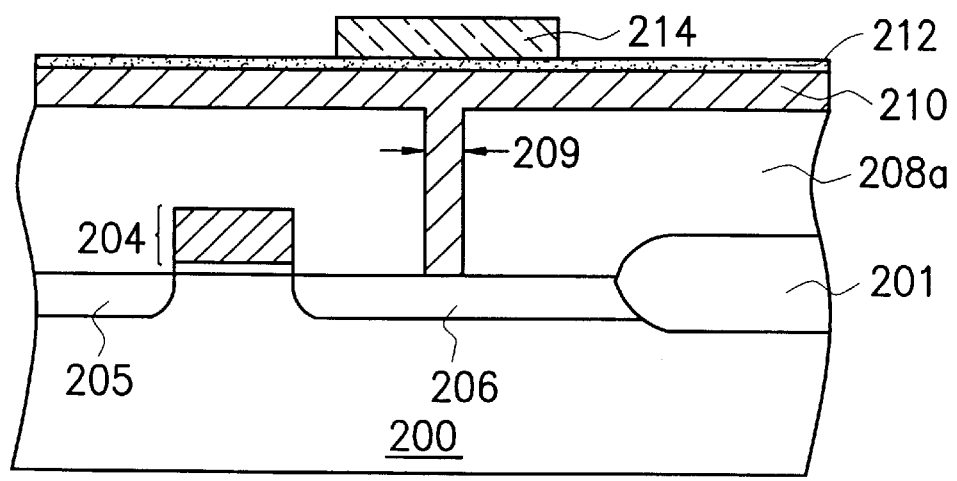

Next, as shown in FIG. 2C, a polysilicon layer 210 is formed over the insulating layer 208a and completely filling the contact opening 209. The polysilicon layer 210 can be formed by a chemical vapor deposition (CVD) using silane $SiH_4$ and phosphine $PH_3$ as the main reactive gases, for example. The reaction temperature for the deposition of polysilicon layer 210 is kept between 530° C. to 580° C. (the reaction temperature in a conventional process must be below 530° C.). In general, impurities can be implanted into the polysilicon layer 210 to increase its electrical conductivity. With the deposition temperature raised to between 530° C. to 580° C., portions of the conductive layer next to the surface will be transformed to micro-crystals. However, these micro-crystals on the surface of conductive layer will be thoroughly damaged by the plasma used in a subsequent etching operation.

A higher deposition temperature for α-silicon saves considerable processing time. For example, if it is necessary to deposit an α-silicon layer to a thickness of 3500 Å, a conventional method using a temperature of about 530° C. requires about 7 hours. In contrast, if the same thickness is deposited using a temperature of about 580° C. according to the method of this invention, it only takes about 2.5 hours.

Thereafter, a thin buffer layer 212 is formed over the polysilicon layer 210. The thin buffer layer 212 can be a thin material layer formed using, for example, a chemical vapor deposition method. The thin buffer layer 212 can be made from material such as silicon nitride, silicon oxynitride ($SiO_xN_y$), silicon dioxide, borophosphosilicate glass (BPSG) or tetra-ethyl-ortho-silicate (TEOS).

In the subsequent step, a patterned photoresist layer 214 is formed over the thin buffer layer 212. The pattern photoresist layer 214 later functions as a mask when the thin buffer layer 212 is patterned.

Figure 2D:
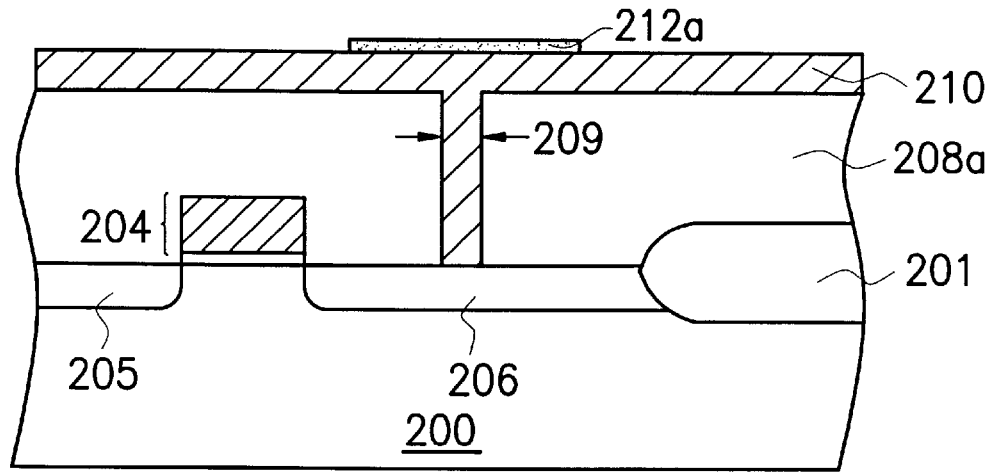

Next, as shown in FIG. 2D, conventional photolithographic and etching methods are used to pattern the thin buffer layer 212 into a thin buffer layer 212a. Finally, the upper surface of the polysilicon layer 210 is exposed.

Figure 2E:
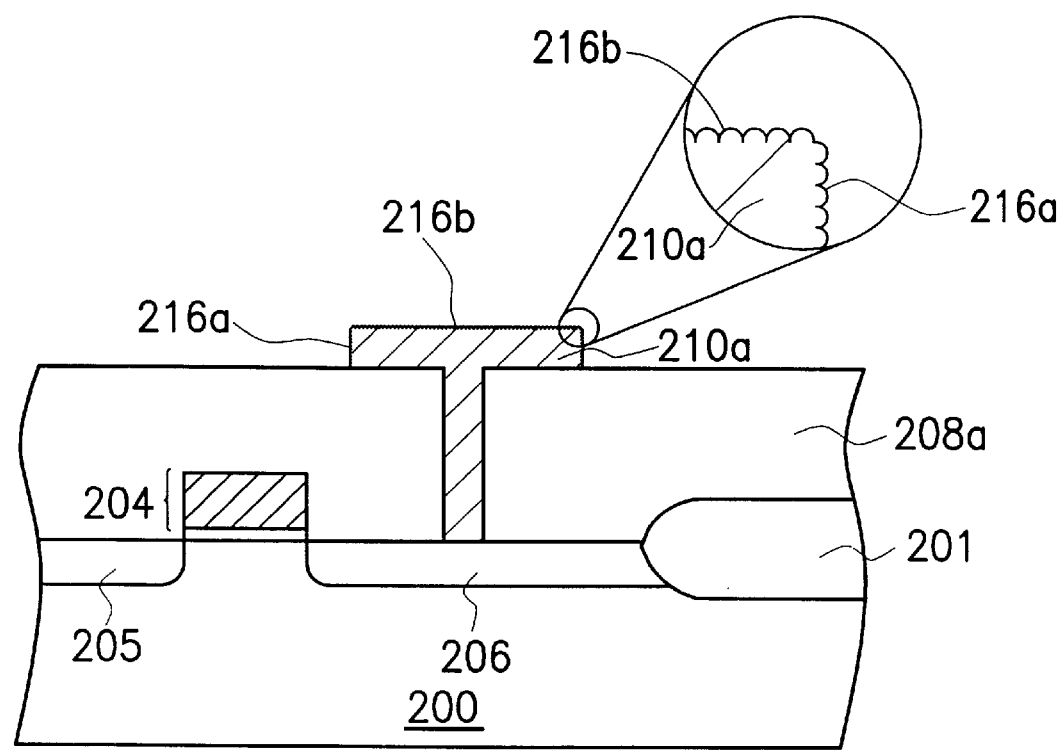

Next, as shown in FIG. 2E, using, the thin buffer layer 212a as a mask, a dry etching method (that is, a plasma etching method) is used to pattern the polysilicon layer 210 into a portion of the lower electrode. Finally, the polysilicon layer 210 is turned into a polysilicon 210a while a portion of the insulating layer 208a is exposed.

In the plasma etching operation, an etchant having a moderate etching selectivity ratio between polysilicon layer 210 and thin buffer layer 212a is used. The thin buffer layer 212a acts as a buffer mask in the etching operation. By selecting a suitable material for the thin buffer layer 212a, so that its etching rate is slower than the polysilicon layer 210, and also by selecting a correct thickness for the thin buffer layer 212a, precise control of the etching can be made so that the entire thin buffer layer 212a is etched away just when the etching stop layer (the insulating layer 208) is reached. Hence, both the sidewall surfaces 216a and the top surface 216b (because the thin buffer layer 212a on top is etched away at the same time) of the polysilicon layer 210a are ultimately bombarded by the plasma, which breaks up the micro-crystals on their surfaces. In other words, both the sidewall surfaces 216a and the top surface 216b turn into a highly amorphous polysilicon layer. Therefore, the entire surface of the polysilicon layer 210a that serves as a lower electrode is in the α-silicon state.

Thereafter, the polysilicon layer 210a is heated to the phase transition temperature of about 560° C. to 590° C. so that the α-silicon on the surface of the polysilicon layer 210a is converted into hemispherical grain polysilicon. Consequently, unlike the conventional method that has a non-uniform coating of hemispherical grain polysilicon due to the presence of micro-crystals on the top surface 216b, both the sidewall surfaces 216a and the top surface 216b of the polysilicon layer 210a have a layer of uniformly coated hemispherical grain polysilicon.

Finally, a dielectric thin film can be deposited over the exposed polysilicon layer 210a with a hemispherical grain polysilicon layer on top, and a conductive layer can be formed over the dielectric layer serving as the upper electrode.

In summary, the characteristics of this invention include:

1. This invention utilizes plasma-enhanced polysilicon etching techniques to etch the surface of the lower electrode. Therefore, the entire lower electrode surface is turned into the α-silicon state because plasma-enhanced polysilicon etching is capable of breaking the polysilicon surface so that the polysilicon surface becomes highly amorphous. As a result, this invention permits a higher polysilicon deposition temperature, up from the conventional value of below 530° C. to roughly between 530° C. to 580° C.

2. Using a higher reacting temperature of between 530° C. to 580° C., the rate of formation of the α-silicon is considerably higher. Thus, processing time is greatly reduced and productivity is increased.

3. The processing methods used in this invention are compatible with other semiconductor manufacturing procedures. Hence, the invention can be easily implemented on a production line.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a layer of hemispherical grain polysilicon over the lower electrode of a capacitor, the method comprising the steps of:

provididng a substrate that has a field effect transistor already formed thereon, wherein the field effect transistor at least includes a source/drain region;

forming an insulating layer over the substrate;

patterning the insulating layer to form a contact opening that exposes the source/drain region;

forming a polysilicon layer over the insulating layer filling the contact opening;

forming a thin buffer layer over the polysilicon layer prior to patterning the polysilicon layer;

patterning the thin buffer layer so that a portion of the polysilicon layer, which is to become the lower electrode of the capacitor, is covered, while the remaining portion of the polysilicon layer is exposed;

performing a plasma etching operation using the patterned thin buffer layer as a buffer so that the thin buffer layer and the exposed portion of the polysilicon layer are removed at the same time; and performing a heat treatment process to covert the polysilicon on the surface of the polysilicon layer into hemispherical grain polysilicon.

2. The method of claim 1, wherein the step of forming the polysilicon layer includes a chemical vapor deposition method.

3. The method of claim 1, wherein the step of forming the polysilicon layer is carried out at a temperature lower than 580° C. but higher than 530° C.

4. The method of claim 1, wherein the step of forming the thin buffer layer includes a chemical vapor deposition method.

5. The method of claim 1, wherein in the plasma-etching operation, the rate of etching for the thin buffer layer is slower than the rate of etching for the polysilicon layer.

6. The method of claim 5, wherein the step of forming the thin buffer layer includes depositing silicon nitride.

7. The method of claim 5, wherein the step of forming the thin buffer layer includes depositing silicon oxynitride.

8. The method of claim 5, wherein the step of forming the thin buffer layer includes depositing silicon dioxide.

9. The method of claim 5, wherein the step of forming the thin buffer layer includes depositing borophosphosilicate glass.

10. The method of claim 5, wherein the step of forming the thin buffer layer includes depositing tetra-ethyl-orthosilicate.

11. A method of producing hemispherical grain polysilicon, the method the steps of:

providing a substrate;

forming a polysilicon layer over the substrate;

forming a patterned thin buffer layer to cover only a portion of the polysilicon layer and leave the other portion of the polysilicon layer exposed;

performing a plasma-etching operation using the patterned thin layer as a buffer so that the thin buffer layer and a portion of the polysilicon layer are removed, wherein the thin buffer layer is sufficiently thin to be removed simultaneously with exposed portion of the polysilicon layer but thick enough to prevent the portion of the polysilicon layer covered thereby from being removed; and performing a heat treatment process to convert the polysilicon on both a sidewall surface and a top surface of the polysilicon layer remaining after performing the plasma-etching operation.

12. The method of claim 11, wherein the step of forming the polysilicon layer includes a chemical vapor deposition method.

13. The method of claim 11, wherein the step of forming the polysilicon layer is carried out at a temperature lower than 580° C. but higher than 530° C.

14. The method of claim 11, wherein the step of forming the thin buffer layer includes a chemical vapor deposition method.

15. The method of claim 11, wherein in the plasma-etching operation, the rate of etching for the thin buffer layer is slower than the rate of etching for the polysilicon layer.

16. The method of claim 15, wherein the step of forming the thin buffer layer includes depositing silicon nitride.

17. The method of claim 15, wherein the step of forming the thin buffer layer includes depositing silicon oxynitride.

18. The method of claim 15, wherein the step of forming the thin buffer layer includes depositing silicon dioxide.

19. The method of claim 15, wherein the step of forming the thin buffer layer includes depositing borophosphosilicate glass.

20. The method of claim 15, wherein the step of forming the thin buffer layer includes depositing tetra-ethyl-ortho-silicate.

21. A method of forming a layer of hemispherical grain polysilicon over the lower electrode of a capacitor, comprising the steps of:

providing a substrate that has a field effect transistor already formed thereon, wherein the field effect transistor at least includes a source/drain region;

forming an insulating layer over the substrate;

patterning the insulating layer to form a contact opening that exposes the source/drain region;

forming a polysilicon layer over the insulating layer filling the contact opening, wherein the polysilicon layer has not been patterned yet at this step;

forming a thin buffer layer over the polysilicon layer right after which is formed; patterning the thin buffer layer to expose a portion of the polysilicon layer which is not used for forming the lower electrode;

performing a plasma etching operation on both the patterned thin buffer layer and the exposed polysilicon layer to form the lower electrode with both a top surface and a sidewall surface being converted into an amorphous state by being bombarded during the step of plasma etching operation; and converting the top surface and the sidewall surface of the polysilicon layer into hemispherical grain polysilicon.

22. The method of claim 21, wherein the step of forming the polysilicon layer includes a chemical vapor deposition method.

23. The method of claim 21, wherein the step of forming the thin buffer layer includes a chemical vapor deposition method.

24. The method of claim 21, wherein in the plasma-etching operation, the rate of etching for the thin buffer layer is slower than the rate of etching for the polysilicon layer.

25. The method of claim 24, wherein the step of forming thin buffer layer includes depositing silicon nitride.

26. The method of claim 24, wherein the step of forming thin buffer layer includes depositing silicon oxynitride.

27. The method of claim 24, wherein the step of forming thin buffer layer includes depositing silicon dioxide.

28. The method of claim 24, wherein the step of forming thin buffer layer includes depositing borophosphosilicate glass.

29. The method of claim 24. wherein the step of forming thin buffer layer includes depositing tetra-ethyl-ortho-silicate.

* * * * *